United States Patent
Tihanyi

Patent Number: 6,018,263

Date of Patent: *Jan. 25, 2000

[54] TRIGGER CIRCUIT FOR A FIELD-EFFECT-CONTROLLED POWER SEMICONDUCTOR COMPONENT

[75] Inventor: Jenoe Tihanyi, Kirchheim, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/906,185

[22] Filed: Aug. 4, 1997

[30] Foreign Application Priority Data

Aug. 2, 1996 [DE] Germany .................. 196 31 362

[51] Int. Cl.[7] ............................................. H03K 17/687
[52] U.S. Cl. ...................... 327/374; 327/546; 327/389; 327/377; 361/101; 323/277
[58] Field of Search ...................... 327/434, 377, 327/376, 427, 384, 374, 389, 546; 361/103, 101, 58; 323/277

[56] References Cited

U.S. PATENT DOCUMENTS 4,877,982  10/1989  Walker ............................ 327/374

FOREIGN PATENT DOCUMENTS 358164323A  9/1983  Japan ............................ 327/389
404122119   4/1992  Japan ............................ 327/374

*Primary Examiner*—Dinh T. Le
*Attorney, Agent, or Firm*—Herbert L. Lerner; Laurence A. Greenberg

[57] ABSTRACT

A trigger circuit for a field-effect-controlled power semiconductor component has a controllable gate resistor for the power semiconductor component, which has low impedance in a normal situation and is switched to high impedance in the event of a short circuit. As a result, the turn-on time in the normal situation is shortened, and limiting the gate-to-source voltage of the power semiconductor component in the short-circuit situation is made possible.

6 Claims, 1 Drawing Sheet

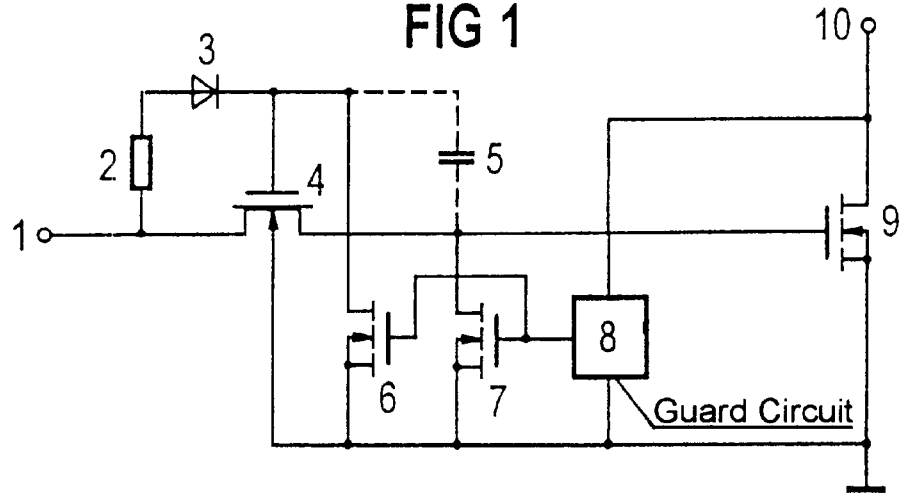
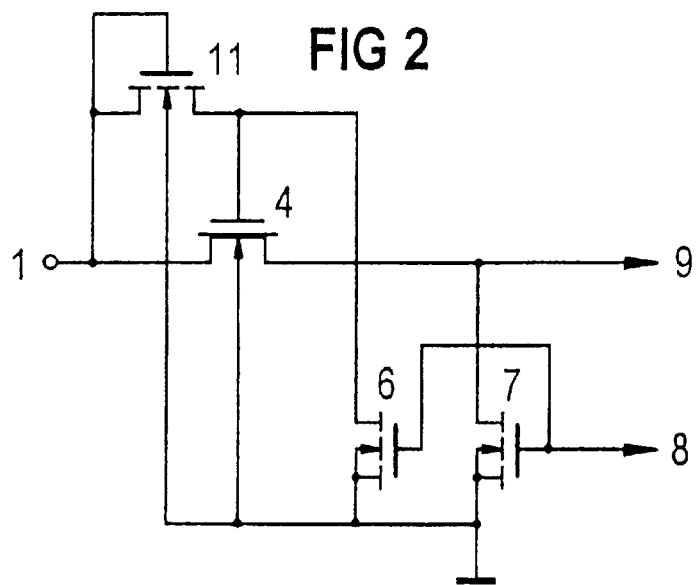
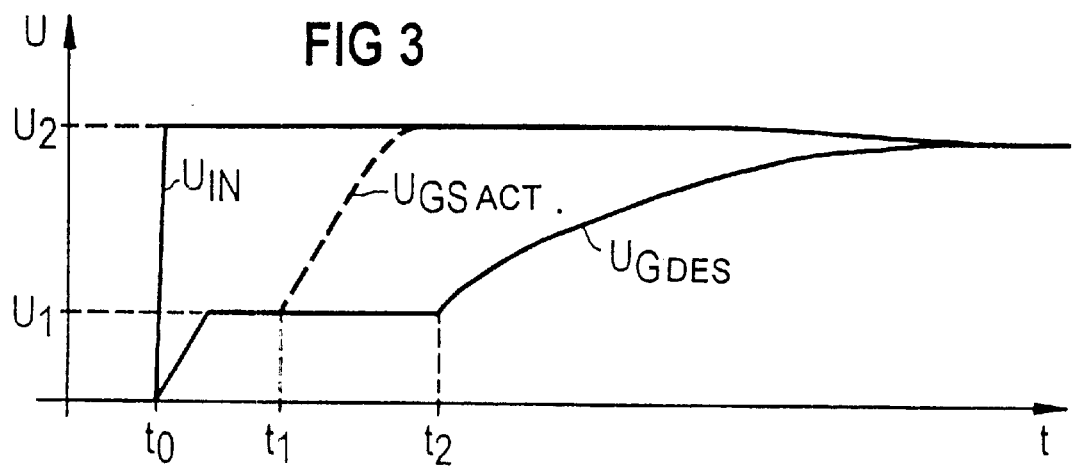

TRIGGER CIRCUIT FOR A FIELD-EFFECT-CONTROLLED POWER SEMICONDUCTOR COMPONENT

BACKGROUND OF THE INVENTION

1. Field of the Invention

The invention relates to a trigger circuit for a field-effect-controlled power semiconductor component having a conducting-state MOSFET through which a trigger signal can be delivered to the gate terminal of the power semiconductor component, in the event that the conducting-state MOSFET is conducting.

One such trigger circuit is known, for instance, from German Published, Non-Prosecuted Patent Application DE 42 05 753 A1, corresponding to U.S. Pat. No. 5,272,399. FIG. 1 thereof discloses a MOSFET 1 having a gate which is connected through a resistor 6 to a control input. A load path of a MOSFET, which is triggered as a function of the drain-to-source voltage of the power semiconductor 1, is connected between the gate and a source of the power semiconductor 1. Such a circuit configuration is used in power semiconductor components with an MOS input in order to limit the current $I_{DS}$ in the event of a short circuit. That kind of additional circuit in principle includes a series resistor, in the present case the resistor 6, which is needed in order to assure the current limitation.

The disadvantage of such a configuration is that the turn-on speed is limited by the serial resistor and thus becomes relatively long.

Another circuit configuration of that generic type is known from U.S. Pat. No. 5,506,539. The circuit configuration which is shown particularly in FIG. 3 thereof has a guard circuit that switches a controllable resistor to high impedance and low-impedance states. However, the circuit configuration disclosed therein is extremely expensive and complicated to manufacture.

SUMMARY OF THE INVENTION

It is accordingly an object of the invention to provide a trigger circuit for a field-effect-controlled semiconductor component, which overcomes the hereinafore-mentioned disadvantages of the heretofore-known devices of this general type, in which the turn-on time is shortened and which can be produced in a simple way by using only a few components.

With the foregoing and other objects in view there is provided, in accordance with the invention, a trigger circuit for a field-effect-controlled power semiconductor component, comprising a conducting-state MOSFET for delivering a trigger signal to a gate terminal of a field-effect-controlled power semiconductor component when the conducting-state MOSFET is conducting; and a guard circuit for generating a control signal in an emergency operation mode; the conducting-state MOSFET having a gate-to-source capacitor charged upon turn-on for switching the power semiconductor component into conduction, the gate-to-source capacitor remaining charged until the control signal blocks the conducting-state MOSFET.

The principle of the invention is that a conducting-state MOSFET is used, which is switched to high impedance or low impedance as a function of the state of the guard circuit (active or inactive).

In accordance with another feature of the invention, the gate-to-source capacitor of the conducting-state MOSFET is charged upon the first turn-on edge of an input signal. The gate-to-source capacitor remains charged until such time as it is discharged as a control signal of the guard circuit, for instance at an excess temperature or in the event of a short circuit. In this so-called emergency operation mode, the conducting-state MOSFET is turned off. As a result, the gate-to-source voltage at the power semiconductor component can be reduced through a suitable switching device and the short-circuit current can thus be limited.

In accordance with a further feature of the invention, the charging of the gate-to-source capacitor of the conducting-state MOSFET and the switching of the power semiconductor component take place simultaneously in the emergency operation mode.

In accordance with an added feature of the invention, there is provided an enhancement MOSFET triggered by the guard circuit in the emergency operation mode, the enhancement MOSFET having a load path connected between a gate terminal of the conducting-state MOSFET and ground.

In accordance with an additional feature of the invention, the conducting-state MOSFET is a depletion MOSFET.

In accordance with yet another feature of the invention, the trigger resistor for the conducting-state MOSFET is constructed as a switching diode that triggers the gate of the conducting-state MOSFET in the direction that the electrical current flows.

In accordance with a concomitant feature of the invention, the switching diode is an MOS diode.

Other features which are considered as characteristic for the invention are set forth in the appended claims.

Although the invention is illustrated and described herein as embodied in a trigger circuit for a field-effect-controlled power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a first exemplary embodiment of a configuration according to the invention;

FIG. 2 is a schematic circuit diagram of a second exemplary embodiment of the configuration according to the invention, in which only relevant switch elements are shown; and FIG. 3 is a graph showing a course over time of a control signal applied to an input signal and of a gate-to-source voltage, with and without the configuration of the invention.

DESCRIPTION OF THE PREFERRED EMBODIMENTS

Referring now to the figures of the drawings in detail and first, particularly, to FIG. 1 thereof, it is seen that reference numeral 1 indicates an input signal, to which a trigger signal can be applied. The input signal is connected through a load path of a conducting-state or on-state MOSFET 4 to a gate of a power MOSFET 9. The input signal 1 is also connected through a resistor 2 and a diode 3 connected in the flow direction to a gate of the conducting-state MOSFET 4. The gate of the conducting-state MOSFET 4 is connected through a load path of a first MOSFET 6 to ground. A substrate terminal of the conducting-state MOSFET 4 is also connected to ground.

A gate-to-source capacitor 5 of the conducting-state MOSFET 4 is shown in dashed lines between a cathode terminal of the diode 3 and the gate terminal of the power MOSFET 9. A guard circuit 8 which is provided between drain and source terminals of the power MOSFET 9 picks up a voltage between the drain and the source. In an emergency, for instance in the event of an excess of temperature, a voltage overload, a short circuit, or the like, the guard circuit 8 generates a control signal at its output. The control signal is delivered both to a gate of the first MOSFET 6 and to a gate of a second MOSFET 7. In the present case, both MOSFETs 6, 7 are enhancement MOSFETs, which can be made conducting by this control signal. The gate capacitor of the MOSFET 4 and a gate capacitor of the MOSFET 9 are discharged simultaneously. A load path of the second MOSFET 7 is connected between the gate terminal of the power MOSFET 9 and ground.

In the present exemplary embodiment, the power MOSFET 9 is a low-side switch, having a drain terminal which is connected to a connection terminal 10 and a source terminal that is connected to ground. However, it would also be conceivable to construct the power MOSFET 9 as a high-side switch.

In the normal operating mode, a positive trigger signal at a turn-on edge of the input signal 1 charges the gate-to-source capacitor 5 of the conducting-state MOSFET 4, through the use of the diode 3, to precisely this trigger voltage and thus makes the conducting-state MOSFET 4 have low impedance. As long as the circuit is functioning in the normal operating mode and there is no excess current, this state, in other words the charging at the gate of the conducting-state MOSFET 5, is maintained.

In the so-called emergency operation mode, for instance in the event of a short circuit, overvoltage, excess temperature, or the like, the guard circuit 8 is activated and triggers both the first MOSFET 6 and the second MOSFET 7. This makes the MOSFET 6 conducting and discharges the gate capacitor 5 of the MOSFET 4. As a result of this provision, the resistance of the load path of the MOSFET 4 rises, and the current limitation of the power MOSFET 9 is then activated in such a way that the second MOSFET 7 is made conducting and the gate-to-source voltage of the power MOSFET 9 is reduced.

FIG. 2 shows an exemplary embodiment of the resistor 2 and the diode 3 of FIG. 1. All of the other components are as in FIG. 1, and for the sake of simplicity elements 8, 9 and 10 are not shown in FIG. 2.

The resistor 2 and the diode 3 are realized by an enhancement MOSFET 11 in FIG. 2. The MOSFET 11 has a load path which is connected between the input signal 1 and the gate terminal of the conducting-state MOSFET 4. A gate terminal of the MOSFET 11 is also connected to the input signal 1. A substrate terminal of the MOSFET 11 is connected to ground.

FIG. 3 shows a course over time of the control signal applied to the input signal 1 and of the gate-to-source voltage at the power MOSFET 9, in each case with and without the circuit configuration of the invention.

At a time $t_0$, the trigger signal $U_{IN}$ is applied to the input signal 1. In a circuit configuration according to the prior art, the course of the gate-to-source voltage at the power MOSFET 9 is represented by a course of a curve $U_{GSDES}$. The voltage first rises to a medium value $U_1$ and then at a time $t_2$ it begins, initially with an arctan-like course, to asymptotically approach the voltage $U_2$, which is substantially equivalent to the input voltage $U_{IN}$.

Reference symbol $U_{GSACT}$ represents a course of the gate-to-source voltage at the power MOSFET 9 when a configuration according to the invention comes into use. In contrast to the prior art course of the curve $U_{GSDES}$, the course of the gate-to-source voltage curve $U_{GSACT}$ at the power MOSFET 9 according to the invention already rises quickly at the time $t_1$, which is between the time $t_0$ and the time $t_2$, and approaches the actual value $U_2$ considerably earlier.

The invention can be used both in low-side switches as in FIG. 1 or FIG. 2, and in high-side switches. It is essential that the invention ensure that the gate resistance of the power MOSFET 9, that is the load path of the conducting-state MOSFET 4, is low in the normal operating mode and high in the emergency operation mode. The invention can be constructed by using all known technologies, either in integrated form or discrete form.

As compared with the prior art, the present invention proves to be advantageous since it needs many fewer components to realize the circuit configuration of the invention. Moreover, through the use of the present invention, the two MOSFETs 6, 7 that are intended for discharging the gate-to-source capacitor of the conducting-state MOSFET 4 can be made quite small.

I claim:

1. A trigger circuit for a field-effect-controlled power semiconductor transistor, comprising:

a conducting-state MOSFET having a gate terminal, an input terminal, and an output terminal for delivering a trigger signal to a gate terminal of the field-effect-controlled power semiconductor transistor when said conducting-state MOSFET is conducting;

a guard circuit operatively connected between a drain and a source of the power semiconductor transistor for generating a control signal to the gate terminal of the power semiconductor transistor and said qate terminal of said conducting-state MOSFET;

said conducting-state MOSFET having a gate-to-source capacitor charged upon turn-on for switching the power semiconductor transistor into conduction, the gate-to-source capacitor remaining charged until the control signal blocks said conducting-state MOSFET; and a series circuit of a diode and a resistor, said series circuit being connected between said input terminal and said gate terminal of said conducting-state MOSFET and charging the gate-to-source capacitor.

2. The trigger circuit according to claim 1, wherein the gate-to-source capacitor of said conducting-state MOSFET is charged at a first positive turn-on edge of an input signal.

3. The trigger circuit according to claim 1, wherein a discharging of the gate-to-source capacitor of said conducting-state MOSFET and a switching of the power semiconductor transistor take place simultaneously in the emergency operation mode.

4. The trigger circuit according to claim 1, further including an enhancement MOSFET triggered by said guard circuit, said enhancement MOSFET having a load path connected between said gate terminal of said conducting-state MOSFET and ground.

5. The trigger circuit according to claim 1, wherein said conducting-state MOSFET is a depletion MOSFET.

6. A trigger circuit for a field-effect-controlled power semiconductor transistor, comprising:

a conducting-state MOSFET having a gate terminal, an input terminal, and an output terminal for delivering a trigger signal to a gate terminal of the field-effect-controlled power semiconductor transistor when said conducting-state MOSFET is conducting;

a guard circuit operatively connected between a drain and a source of the power semiconductor transistor for generating a control signal to the gate terminal of the power semiconductor transistor and said gate terminal of said conducting-state MOSFET;

said conducting-state MOSFET having a gate-to-source capacitor charged upon turn-on for switching the power semiconductor transistor into conduction, the gate-to-source capacitor remaining charged until the control signal blocks said conducting-state MOSFET; and a MOSFET-diode connected between said input terminal and said gate terminal of said conducting-state MOSFET and charging the gate-to-source capacitor.

* * * * *